US012211908B2

(12) United States Patent
Singhal et al.

(10) Patent No.: US 12,211,908 B2
(45) Date of Patent: Jan. 28, 2025

(54) PROFILE SHAPING FOR CONTROL GATE RECESSES

(71) Applicant: Applied Materials, Inc., Santa Clara, CA (US)

(72) Inventors: Akhil Singhal, Portland, OR (US); Allison Yau, Cupertino, CA (US); Sang-Jin Kim, Santa Clara, CA (US); Zeqiong Zhao, Santa Clara, CA (US); Zhijun Jiang, San Jose, CA (US); Deenesh Padhi, Sunnyvale, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/460,290

(22) Filed: Sep. 1, 2023

(65) Prior Publication Data

US 2023/0411462 A1    Dec. 21, 2023

Related U.S. Application Data

(62) Division of application No. 17/073,060, filed on Oct. 16, 2020, now Pat. No. 11,784,229.

(51) Int. Cl.
*H01L 21/28* (2006.01)
*H01L 21/311* (2006.01)
(Continued)

(52) U.S. Cl.
CPC .. *H01L 29/40114* (2019.08); *H01L 21/31116* (2013.01); *H01L 21/32137* (2013.01); *H01L 29/42324* (2013.01)

(58) Field of Classification Search
None
See application file for complete search history.

(56) References Cited

U.S. PATENT DOCUMENTS 7,811,891 B2   10/2010   Orlowski et al.
10,475,515 B2  11/2019   Li et al.
(Continued)

FOREIGN PATENT DOCUMENTS

KR   20000076261 A   12/2000

OTHER PUBLICATIONS

Application No. PCT/US2021/071885, International Preliminary Report on Patentability, Mailed On Apr. 27, 2023, 5 pages.
(Continued)

*Primary Examiner* — Xiaoming Liu
(74) *Attorney, Agent, or Firm* — Kilpatrick Townsend & Stockton LLP

(57) ABSTRACT

Exemplary semiconductor structures and processing methods may include forming a first portion of a first semiconductor layer characterized by a first etch rate for an etch treatment, forming a second portion of the first semiconductor layer characterized by a second etch rate that is less than the first etch rate for the etch treatment, and forming a third portion of the first semiconductor layer characterized by a third etch rate that is greater than the second etch rate. The processing methods may further include etching an opening through the first semiconductor layer, where the opening has a height and a width, and where the opening is characterized by a variation in the width between a midpoint of the height of the opening and an endpoint of the opening that is less than or about 5 Å.

8 Claims, 6 Drawing Sheets

(51) Int. Cl.
  *H01L 21/3213*  (2006.01)
  *H01L 29/423*  (2006.01)

(56) References Cited

U.S. PATENT DOCUMENTS

| | | | |
|---|---|---|---|
| 11,784,229 | B2 | 10/2023 | Singhal et al. |
| 2002/0187648 | A1* | 12/2002 | Wu .................. H01L 21/30608 |
| | | | 257/E21.549 |
| 2005/0037555 | A1 | 2/2005 | Chen et al. |
| 2006/0281246 | A1 | 12/2006 | Tegen |
| 2010/0230781 | A1 | 9/2010 | Booth, Jr. et al. |
| 2011/0316096 | A1 | 12/2011 | Wei et al. |
| 2015/0372001 | A1 | 12/2015 | Hsu et al. |
| 2016/0181112 | A1 | 6/2016 | Xue et al. |
| 2019/0081155 | A1* | 3/2019 | Xie .................. H01L 29/66553 |
| 2019/0115365 | A1* | 4/2019 | Han ....................... H10B 43/35 |
| 2019/0244933 | A1 | 8/2019 | Or-Bach et al. |
| 2020/0258895 | A1 | 8/2020 | Xiao et al. |
| 2022/0165867 | A1 | 5/2022 | Rachmady |

OTHER PUBLICATIONS

Application No. PCT/US2021/071885, International Search Report and Written Opinion, Mailed On Feb. 7, 2022, 8 pages.
Office Action mailed on Jun. 23, 2024, in corresponding Korean Application No. 10-2023-7016284, 17 pages.

\* cited by examiner

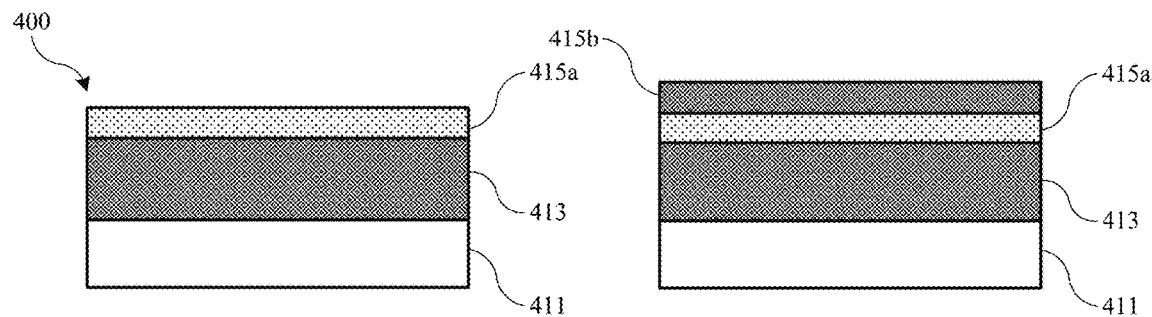
*FIG. 4A*   *FIG. 4B*
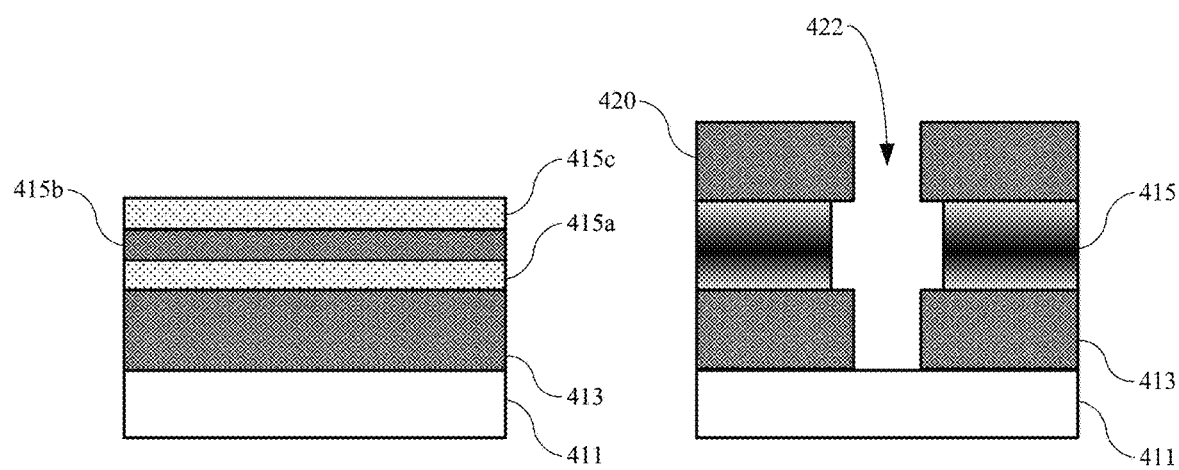
*FIG. 4C*   *FIG. 4D*

PROFILE SHAPING FOR CONTROL GATE RECESSES

CROSS-REFERENCE TO RELATED APPLICATION

This application is a divisional of U.S. Non-Provisional Patent Application Ser. No. 17/073,060, filed Oct. 16, 2020, the content of which is hereby incorporated by reference in its entirety for all purposes.

TECHNICAL FIELD

The present technology relates to semiconductor processes and materials. More specifically, the present technology relates to methods of forming control gate recesses with a substantially straight profile.

BACKGROUND

Integrated circuits are made possible by processes which produce intricately patterned material layers on substrate surfaces. Producing patterned material on a substrate requires controlled methods of formation and removal of exposed material. Stacked memory, such as vertical or 3D NAND, may include the formation of a series of alternating layers of dielectric and semiconductor materials through which a number of memory holes or apertures may be etched. Material properties of the layers, as well as process conditions and materials for etching, may affect the uniformity and integrity of the formed structures. As devices continue to scale, conventional technologies may be incapable of adequate processing.

Thus, there is a need for improved systems and methods that can be used to produce high quality devices and structures. These and other needs are addressed by the present technology.

SUMMARY

The present technology includes embodiments of semiconductor processing methods to form and etch a semiconductor layer with substantially straight profile for a recessed surface. In embodiments, the semiconductor layer may be formed with increased etch resistance in the middle of the layer compared to the ends of the layer. This etch resistance profile counters a tendency of dry etching operations to etch the middle of the semiconductor layer at a faster rate than the ends of the layer that are in contact with adjacent layers made from other materials. When embodiments of the present semiconductor layer is etched, the profile of the recessed surface of the layer may be characterized by substantially less concavity than a conventional semiconductor layer having a substantially uniform etch resistance across the depth of the layer. Applications of the present technology include the formation of control gate recesses in multilayer oxide-polysilicon stacks used in floating-gate 3D-NAND devices.

Embodiments of the present technology include semiconductor processing methods that include forming a first portion of a first semiconductor layer characterized by a first etch rate for an etch treatment. Embodiments of the method further include forming a second portion of the first semiconductor layer characterized by a second etch rate that is less than the first etch rate for the etch treatment. In embodiments, the method may further include forming a third portion of the first semiconductor layer characterized by a third etch rate that is greater than the second etch rate. The method may still further include etching an opening through the first semiconductor layer, where the opening has a height and width. The opening may be characterized by a variation in the width between a midpoint of the height of the opening and an endpoint of the opening that is less than or about 5 Å.

In additional embodiments, the first semiconductor layer may include polysilicon, and may be formed between two dielectric layers. In further embodiments, the dielectric layers may be formed from silicon oxide. In still further embodiments, the second portion of the first semiconductor layer may be characterized by a greater atomic percentage of phosphorous than the first portion or the third portion of the semiconductor layer. In yet additional embodiments, the second portion of the first semiconductor layer may be characterized by a higher amount of stress than the first portion or the third portion of the semiconductor layer. In still additional embodiments, the method may further include forming a second semiconductor layer after the formation of the first semiconductor layer. The second semiconductor layer may have an average etch rate for the etch treatment that is less than an average etch rate for the first semiconductor layer. In embodiments, the second semiconductor layer may have at least three portions characterized by different etch rates for the etch treatment.

The present technology may further include semiconductor processing methods that include flowing deposition precursors into a substrate processing region of a semiconductor processing chamber. In embodiments, the deposition precursors may include a silicon-containing precursor and a doping precursor. The deposition precursors may deposit a first portion of a doped polysilicon layer on a substrate in the substrate processing region of the semiconductor processing chamber. Following the deposition of the first portion of the doped polysilicon layer, a flow rate ratio of the doping precursor to the silicon-containing precursor may be increased. The deposition precursors with the changed flow rate ratio may deposit a second portion of a doped polysilicon layer on the substrate. The second portion may be characterized by a lower etch rate for an etch treatment than the first portion of the doped polysilicon layer. The method may further include decreasing a flow rate ratio of the doping precursor to the silicon-containing precursor and depositing a third portion of the doped polysilicon layer on the substrate with the deposition precursors. The third portion of the polysilicon layer may be characterized by a higher etch rate for the etch treatment than the second portion of the doped polysilicon layer.

In additional embodiments, the silicon-containing precursor may include silane ($SiH_4$). In still further embodiments, the doping precursor may include a phosphorous-containing precursor. In yet further embodiments, the method may include etching an opening through the doped polysilicon layer. The opening has a height and a width, and may be characterized by a variation in the width between a midpoint of the height of the opening and an endpoint of the opening that is less than or about 5 Å. In additional embodiments, the substrate may include a first dielectric layer upon which the first portion of the doped polysilicon layer may be deposited. In still additional embodiments, the method may include depositing a second dielectric layer on the doped polysilicon layer.

The present technology may also include embodiments of semiconductor structures. In embodiments, these structures may include at least one pair of layer that include a dielectric layer and a semiconductor layer. In further embodiments, the semiconductor layer may include a first portion characterized by a first etch rate for an etch treatment, a second portion that is characterized by a second etch rate that is less than the first etch rate, and a third portion of the semiconductor layer that is characterized by a third etch rate that is greater than the second etch rate.

In additional embodiments, the dielectric layer may include silicon oxide. The yet further embodiments, the semiconductor layer may include doped polysilicon. In still additional embodiments, the second portion of the semiconductor layer may be characterized by a greater atomic percentage of phosphorous than the first portion or third portion of the semiconductor layer. In yet further embodiments, the second portion of the semiconductor layer may be characterized by a higher amount of stress than the first portion or the third portion of the semiconductor layer. In yet additional embodiments, the at least one pair of layers in the semiconductor structure may be greater than or about 50 pairs of layers.

Such technology may provide numerous benefits over conventional semiconductor processing methods and structures. For example, the methods may produce films characterized by straighter recessed edge profiles in an etch semiconductor layer. Additionally, the operations of embodiments of the present technology may produce semiconductor devices, such as floating-gate 3D-NAND devices, with reduced critical dimensions resulting from more precision in the profiles of the control gates. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

FIGS. 4A-4D show schematic cross-sectional views of a substrate during formation operations according to some embodiments of the present technology.

Figure 1:
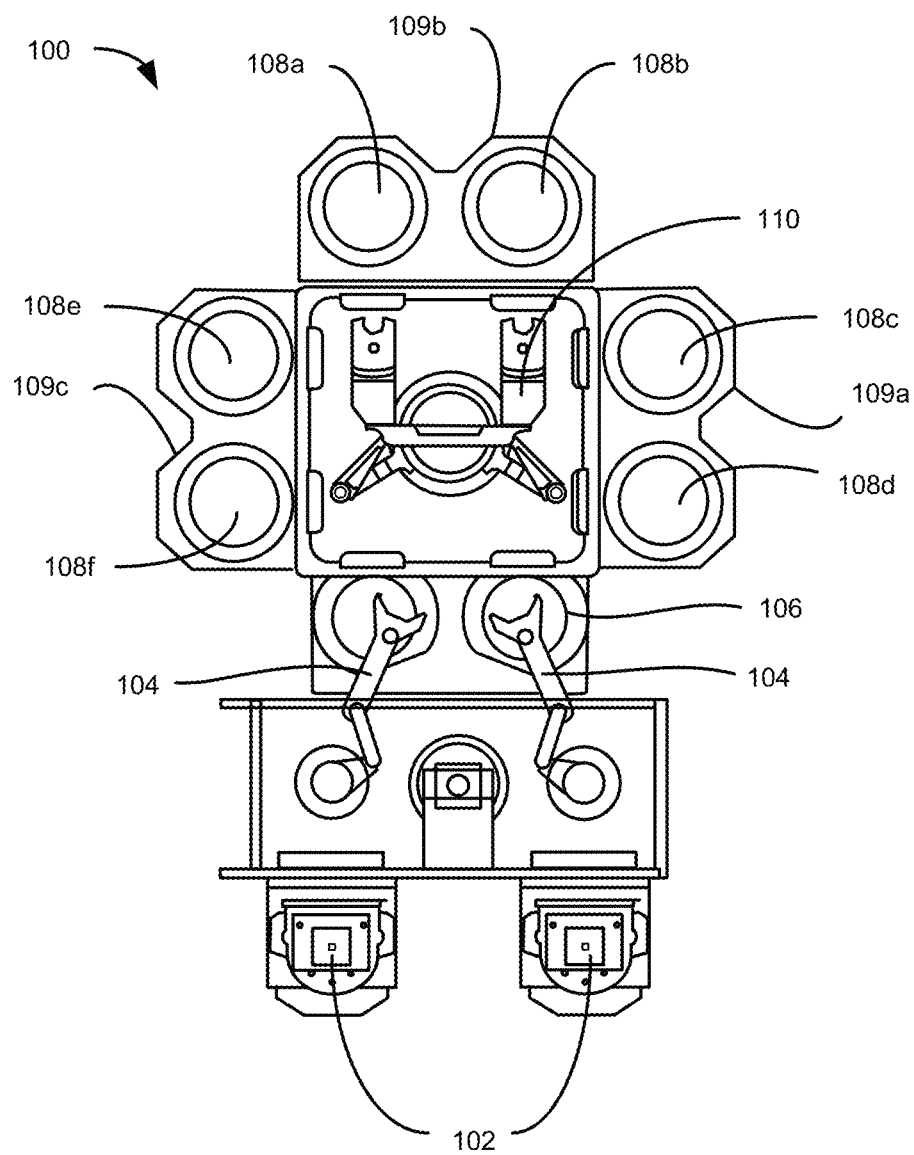
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes semiconductor processing systems, structures, and methods to form a substantially straight recessed surface in a semiconductor layer positioned between dielectric layers. In embodiments, the recessed surface may form part of a recess that has been etched into an end of the semiconductor layer starting from an channel opening that is orthogonally-aligned with the layer. The dielectric layers positioned between the semiconductor layer may form opposite sides of the recess that are substantially perpendicular to the recessed surface. In embodiments, a series of these recesses may be formed in a series of semiconductor layers along a length of the orthogonally-aligned channel opening. In subsequent operations, the recesses may be filed with materials to form a floating-gate portion of a control gate. The substantially straight recessed surface etched into the semiconductor layers may define the shape of an interface between the floating-gate portion and the remainder of the control gate. In embodiments, the series of control gates formed along the length of the channel opening may be part of a floating-gate, 3D-NAND memory device.

Embodiments of the present technology address problems with conventional methods of etching recessed surfaces in semiconductor layers. In many conventional methods the etch treatment etches the recess unevenly between the middle of the semiconductor layer and the ends of the layer that make contact with the adjacent dielectric layers. The uneven etching usually involves a faster etch rate for the semiconductor material in the middle of the layer compared to the etch rates at the ends of the layer. Consequently, the recessed surface is formed with a concave shape that is etched deeper in the middle of the layer than at the ends of the layer. In some instances, the difference in the depth of the recessed surface between the middle of the surface and one of the ends of the surface may be greater than or about 10 Å, greater than or about 12.5 Å, greater than or about 15 Å, greater than or about 17.5 Å, greater than or about 20 Å, greater than or about 22.5 Å, greater than or about 25 Å, greater than or about 27.5 Å, greater than or about 30 Å, or more. The larger the difference in this depth (i.e., the greater the extent of the concavity in the recessed surface) the greater the amount of space required for the control gate. As device size continues to be reduced in applications such as 3D-NAND memory devices, the concavity in the recessed surfaces of the control gate can limit further size reductions.

Embodiments of the present technology address these and other problems in the formation of recessed surfaces of semiconductor layer by forming the layers with different etch rates in different portions of the layer. In embodiments, the tendency of an etch treatment to etch the middle of a semiconductor layer faster than the of the layer is countered by forming the layer with an increased etch resistance in the middle of the layer compared to the ends of the layer. In some embodiments, the different etch rates are created in the layer by changing one or more compositional or physical characteristic of different portions of the layer. In embodiments, the middle of the semiconductor layer may have a mole percentage of a doping material that is greater than the endos of the layer. The doping material is selected to impart increased etch resistance to the semiconductor layer with an increasing mole percentage of the doping material. In additional embodiments, the middle of the semiconductor layer may have a higher amount of stress than the ends of the layer. An increased amount of stress imparts an increased etch resistance to the semiconductor layer. In further embodiments, as the effects of increased etch rate of the etch treatment and the increased etch resistance of the portion of the semiconductor layer balance each other out to create an etch front with substantially the same etch rate at all points along the recessing surface. Consequently, the recessed surface formed in the semiconductor layer is substantially straight. In embodiments, the difference in the depth of the recessed surface between the middle of the surface and one of the ends of the surface may be less than or about 5 Å, less than or about 4 Å, less than or about 3 Å, less than or about 2 Å, less than or about 1 Å, or less.

Although the remaining disclosure will routinely identify specific deposition and removal processes utilizing the disclosed technology to produce specific structures, such as for memory, it will be readily understood that the systems and methods are equally applicable to a number of other processes and semiconductor structures. Accordingly, the technology should not be considered to be so limited as for use with the noted deposition and etching processes or chambers alone. Moreover, although an exemplary chamber and system is described to provide foundation for the present technology, it is to be understood that the present technology can be applied to virtually any semiconductor processing chamber or system that may allow the processing operations described.

FIG. 1 shows a top plan view of one embodiment of a processing system 100 of deposition, etching, annealing, or other processing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-109c. A second robotic arm 110 may be used to transport the substrate wafers from the holding area 106 to the substrate processing chambers 108a-f and back. Each substrate processing chamber 108a-f, can be outfitted to perform a number of substrate processing operations including deposition processes described herein in addition to dry etching processes, removal processing, atomic layer deposition, chemical vapor deposition, physical vapor deposition, general etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be configured specifically to deposit dielectric material on the substrate as described below, and the third pair of processing chambers, e.g., 108a-b, may be used to etch the deposited dielectric. In another configuration, all three pairs of chambers, e.g., 108a-f, may be configured to deposit a dielectric film on the substrate. Any one or more of the processes described may be carried out in one or more chambers separated from the fabrication system shown in different embodiments. It will be appreciated that additional configurations of deposition, etching, annealing, and curing chambers for dielectric films are contemplated by system 100.

Figure 2A:
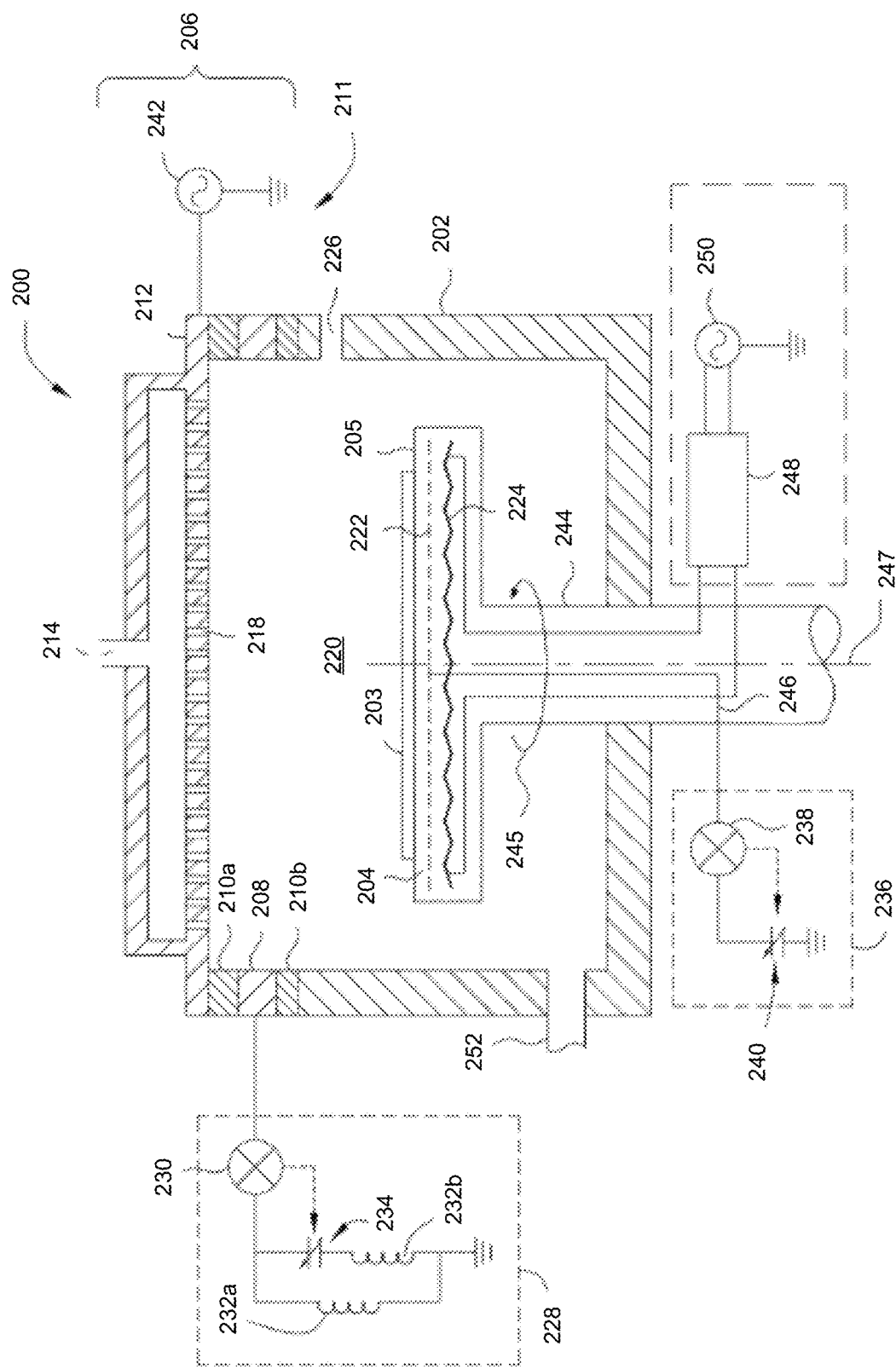
FIG. 2A shows a schematic cross-sectional view of an exemplary processing chamber according to some embodiments of the present technology.

FIG. 2A shows a cross-sectional view of an exemplary processing chamber 200 according to some embodiments of the present technology. The figure may illustrate an overview of a system incorporating one or more aspects of the present technology, and/or which may be specifically configured to perform one or more operations according to embodiments of the present technology. Additional details of chamber 200 or methods performed in the specifically configured chamber may be described further below. Chamber 200 may be utilized to form film layers according to some embodiments of the present technology, although it is to be understood that the methods may similarly be performed in any chamber within which film formation may occur. The processing chamber 200 may include a chamber body 202, a substrate support 204 disposed inside the chamber body 202, and a lid assembly 206 coupled with the chamber body 202 and enclosing the substrate support 204 in a processing volume 220. A substrate 203 may be provided to the processing volume 220 through an opening 226, which may be conventionally sealed for processing using a slit valve or door. The substrate 203 may be seated on a surface 205 of the substrate support during processing. The substrate support 204 may be rotatable, as indicated by the arrow 245, along an axis 247, where a shaft 244 of the substrate support 204 may be located. Alternatively, the substrate support 204 may be lifted up to rotate as necessary during a deposition process.

A plasma profile modulator 211 may be disposed in the processing chamber 200 to control plasma distribution across the substrate 203 disposed on the substrate support 204. The plasma profile modulator 211 may include a first electrode 208 that may be disposed adjacent to the chamber body 202, and may separate the chamber body 202 from other components of the lid assembly 206. The first electrode 208 may be part of the lid assembly 206, or may be a separate sidewall electrode. The first electrode 208 may be an annular or ring-like member, and may be a ring electrode. The first electrode 208 may be a continuous member around a circumference of the processing chamber 200 surrounding the processing volume 220, or may be discontinuous at selected locations if desired. The first electrode 208 may also be a perforated electrode, such as a perforated ring or a mesh electrode, or may be a plate electrode, such as, for example, a secondary gas distributor.

One or more isolators 210a, 210b, which may be a dielectric material such as a ceramic or metal oxide, for example aluminum oxide and/or aluminum nitride, may contact the first electrode 208 and separate the first electrode 208 electrically and thermally from a gas distributor 212 and from the chamber body 202. The gas distributor 212 may define apertures 218 for distributing process precursors into the processing volume 220. The gas distributor 212 may be coupled with a first source of electric power 242, such as an RF generator, RF power source, DC power source, pulsed DC power source, pulsed RF power source, or any other power source that may be coupled with the processing chamber. In some embodiments, the first source of electric power 242 may be an RF power source. In some embodiments the first source of electric power 242 may also be an inductively coupled plasma coil extending about inlet 214, and which may be used to produce or deliver plasma effluents into the processing volume 220.

The gas distributor 212 may be a conductive gas distributor or a non-conductive gas distributor. The gas distributor 212 may also be formed of conductive and non-conductive components. For example, a body of the gas distributor 212 may be conductive while a face plate of the gas distributor 212 may be non-conductive. The gas distributor 212 may be powered, such as by the first source of electric power 242 as shown in FIG. 2, or the gas distributor 212 may be coupled with ground in some embodiments.

The first electrode 208 may be coupled with a first tuning circuit 228 that may control a ground pathway of the processing chamber 200. The first tuning circuit 228 may include a first electronic sensor 230 and a first electronic controller 234. The first electronic controller 234 may be or include a variable capacitor or other circuit elements. The first tuning circuit 228 may be or include one or more inductors 232. The first tuning circuit 228 may be any circuit that enables variable or controllable impedance under the plasma conditions present in the processing volume 220 during processing. In some embodiments as illustrated, the first tuning circuit 228 may include a first circuit leg and a second circuit leg coupled in parallel between ground and the first electronic sensor 230. The first circuit leg may include a first inductor 232a. The second circuit leg may include a second inductor 232b coupled in series with the first electronic controller 234. The second inductor 232b may be disposed between the first electronic controller 234 and a node connecting both the first and second circuit legs to the first electronic sensor 230. The first electronic sensor 230 may be a voltage or current sensor and may be coupled with the first electronic controller 234, which may afford a degree of closed-loop control of plasma conditions inside the processing volume 220.

A second electrode 222 may be coupled with the substrate support 204. The second electrode 222 may be embedded within the substrate support 204 or coupled with a surface of the substrate support 204. The second electrode 222 may be a plate, a perforated plate, a mesh, a wire screen, or any other distributed arrangement of conductive elements. The second electrode 222 may be a tuning electrode, and may be coupled with a second tuning circuit 236 by a conduit 246, for example a cable having a selected resistance, such as 50 ohms, for example, disposed in the shaft 244 of the substrate support 204. The second tuning circuit 236 may have a second electronic sensor 238 and a second electronic controller 240, which may be a second variable capacitor. The second electronic sensor 238 may be a voltage or current sensor, and may be coupled with the second electronic controller 240 to provide further control over plasma conditions in the processing volume 220.

A third electrode 224, which may be a bias electrode and/or an electrostatic chucking electrode, may be coupled with the substrate support 204. The third electrode may be coupled with a second source of electric power 250 through a filter 248, which may be an impedance matching circuit. The second source of electric power 250 may be DC power, pulsed DC power, RF bias power, a pulsed RF source or bias power, or a combination of these or other power sources. In some embodiments, the second source of electric power 250 may be an RF bias power.

The lid assembly 206 and substrate support 204 of FIG. 1 may be used with any processing chamber for plasma or thermal processing. In operation, the processing chamber 200 may afford real-time control of plasma conditions in the processing volume 220. The substrate 203 may be disposed on the substrate support 204, and process gases may be flowed through the lid assembly 206 using inlet 214 according to any desired flow plan. Gases may exit the processing chamber 200 through an outlet 252, which may be coupled with a pump, such as any exhaust pump, including a turbomolecular pump in some embodiments. Electric power may be coupled with the gas distributor 212 to establish a plasma in the processing volume 220. The substrate may be subjected to an electrical bias using the third electrode 224 in some embodiments.

Upon energizing a plasma in the processing volume 220, a potential difference may be established between the plasma and the first electrode 208. A potential difference may also be established between the plasma and the second electrode 222. The electronic controllers 234, 240 may then be used to adjust the flow properties of the ground paths represented by the two tuning circuits 228 and 236. A set point may be delivered to the first tuning circuit 228 and the second tuning circuit 236 to provide independent control of deposition rate and of plasma density uniformity from center to edge. In embodiments where the electronic controllers may both be variable capacitors, the electronic sensors may adjust the variable capacitors to maximize deposition rate and minimize thickness non-uniformity independently.

Each of the tuning circuits 228, 236 may have a variable impedance that may be adjusted using the respective electronic controllers 234, 240. Where the electronic controllers 234, 240 are variable capacitors, the capacitance range of each of the variable capacitors, and the inductances of the first inductor 232a and the second inductor 232b, may be chosen to provide an impedance range. This range may depend on the frequency and voltage characteristics of the plasma, which may have a minimum in the capacitance range of each variable capacitor. Hence, when the capacitance of the first electronic controller 234 is at a minimum or maximum, impedance of the first tuning circuit 228 may be high, resulting in a plasma shape that has a minimum aerial or lateral coverage over the substrate support. When the capacitance of the first electronic controller 234 approaches a value that minimizes the impedance of the first tuning circuit 228, the aerial coverage of the plasma may grow to a maximum, effectively covering the entire working area of the substrate support 204. As the capacitance of the first electronic controller 234 deviates from the minimum impedance setting, the plasma shape may shrink from the chamber walls and aerial coverage of the substrate support may decline. The second electronic controller 240 may have a similar effect, increasing and decreasing aerial coverage of the plasma over the substrate support as the capacitance of the second electronic controller 240 may be changed.

The electronic sensors 230, 238 may be used to tune the respective circuits 228, 236 in a closed loop. A setpoint for current or voltage, depending on the type of sensor used, may be installed in each sensor, and the sensor may be provided with control software that determines an adjustment to each respective electronic controller 234, 240 to minimize deviation from the setpoint. Consequently, a plasma shape may be selected and dynamically controlled during processing. It is to be understood that, while the foregoing discussion is based on electronic controllers 234, 240, which may be variable capacitors, any electronic component with adjustable characteristic may be used to provide tuning circuits 228 and 236 with adjustable impedance.

Figure 2B:
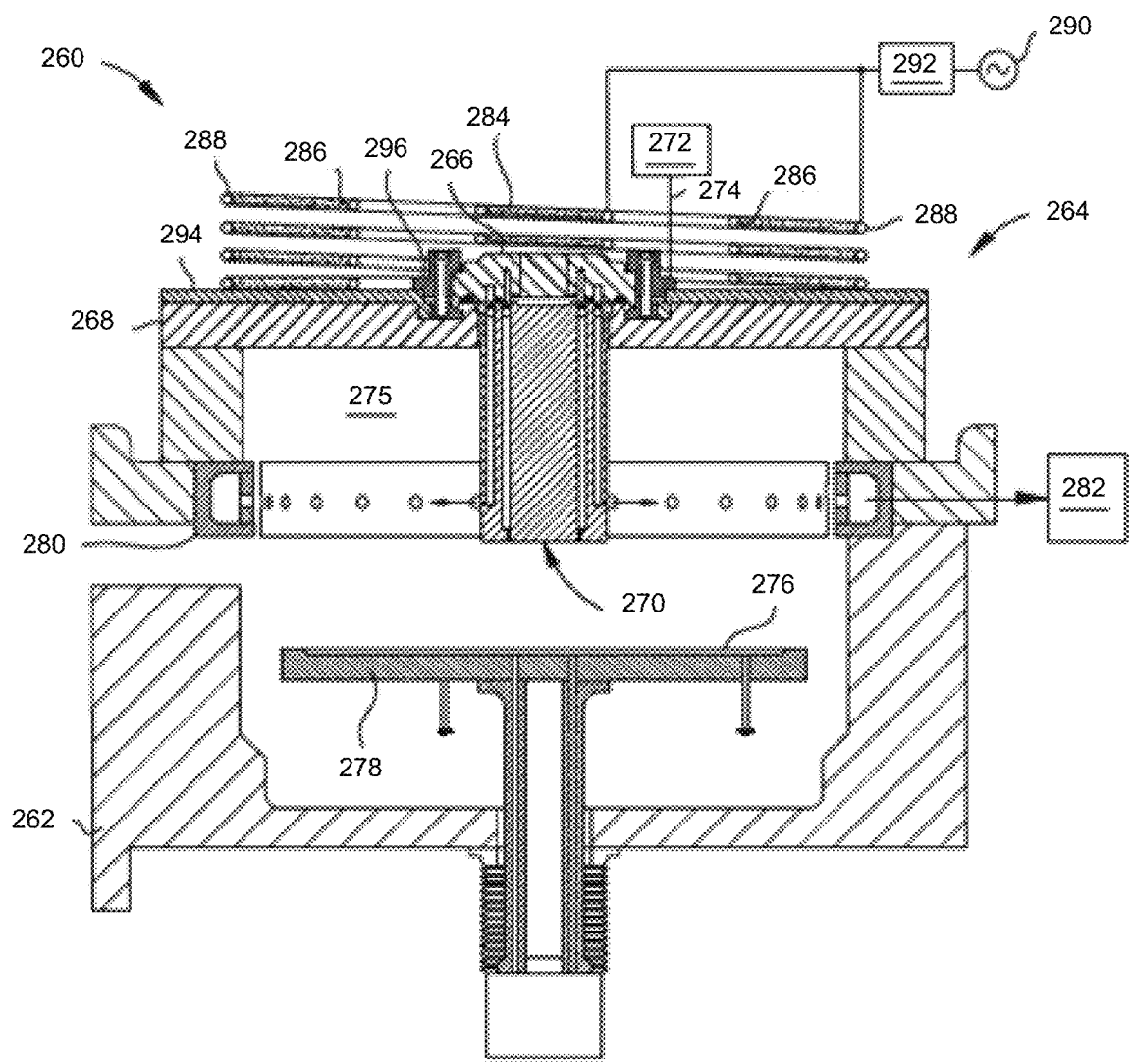
FIG. 2B shows a schematic cross-sectional view of an exemplary processing chamber according to some embodiments of the present technology.

FIG. 2B is a schematic cross-sectional view of a plasma chamber 260 according to some embodiments of the present technology. The figure may illustrate an overview of a system incorporating one or more aspects of the present technology, and/or which may be specifically configured to perform one or more operations according to embodiments of the present technology, such as utilizing an inductively-coupled plasma source. When utilizing a chamber incorporating an inductively-coupled plasma, additional plasma parameters may be controlled, which may affect films produced. For example, the chamber may afford lower processing pressures, which may impact film formation and properties. Plasma chamber 260 may include a chamber body 262 and lid assembly 264, which may be coupled with the chamber body. The lid assembly 264 may include a precursor delivery assembly 266 and a lid 268. The lid 268 may define an aperture or opening 270, which may provide access for one or more processing precursor gases within the processing chamber.

The precursor delivery assembly 266 may be disposed over the lid 268 and extending through the opening 270. The precursor delivery assembly 266 may be coupled with a precursor source 272, and which may provide precursors through an inlet 274 to supply one or more processing precursors into a substrate processing region 275. A substrate 276 may be disposed on a substrate support 278 positioned within or extending into the substrate processing region 275 and coupled with a bias power source or other material or electrical components. The one or more processing precursor gases may exit the substrate processing region 275 via an exhaust ring 280, which may be coupled with an exhaust pump 282. In some embodiments, pump 282 may be a turbo molecular pump, which may allow operational pressures below or about 1 Torr, below or about 500 mTorr, below or about 100 mTorr, below or about 50 mTorr, below or about 20 mTorr, below or about 5 mTorr, or less.

Coupled with the lid assembly 264 may be one or more coils for energizing precursors to produce plasma effluents. The coils may include a number of coil sets, such as inner coils 284, middle coils 286, and outer coils 288, which may all be disposed proximate the lid 268, and may extend about opening 270, for example. The inner coils 284 and the outer coils 288 may be electrically coupled with an RF power source 290 through a matching circuit 292. Power applied to the outer coils 446 from the RF power source 290 may be inductively coupled through the lid 268 to generate plasma from the processing precursors provided from the precursor source 272 within the substrate processing region 275. The RF power source 290 may provide current at a number of different frequencies to control the plasma density, such as a number of ions per unit volume in the plasma, which may define a density of ion flux corresponding to the plasma density over time. The bias power source may control a voltage between the substrate 276 and the plasma produced, and may therefore control an energy and directionality of the ions, such as to draw them towards the substrate. Consequently, plasma chamber 260 may independently control both ion flux and ion energy.

A heater assembly 294 may be positioned adjacent the lid 268, and in some embodiments may be positioned between the lid and the coils as illustrated. The heater assembly 294 may be secured to the lid 408 with clamping members 296. A surface of the substrate may be maintained at a range of temperatures, which may extend between about 100° C. and about 500° C. or more. Plasma chamber 260 may be used in any number of embodiments to produce films as described further below.

Figure 3:
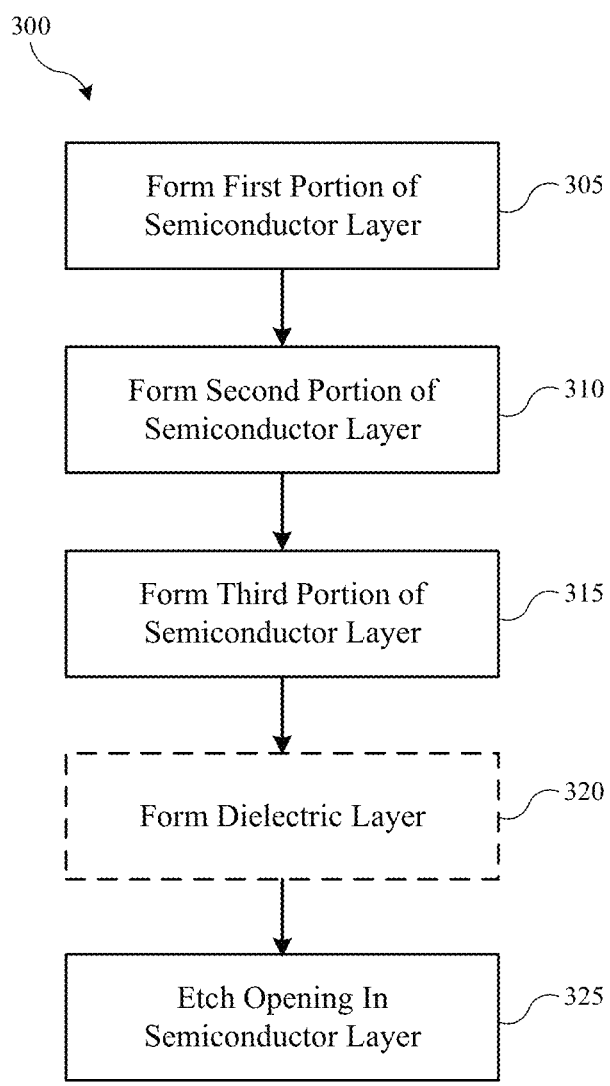
FIG. 3 shows exemplary operations in a method of forming a semiconductor structure according to some embodiments of the present technology.

FIG. 3 shows exemplary operations in a processing method 300 according to some embodiments of the present technology. The method may be performed in a variety of processing chambers, including processing chamber 200 described above, which may be incorporated on system 100, for example. Method 300 may include a number of optional operations, which may or may not be specifically associated with some embodiments of methods according to the present technology. For example, many of the operations are described in order to provide a broader scope of the structural formation, but are not critical to the technology, or may be performed by alternative methodology as would be readily appreciated. Method 300 may describe operations shown schematically in FIGS. 4A-4D, the illustrations of which will be described in conjunction with the operations of method 300. It is to be understood that the figures illustrate only partial schematic views, and a substrate may contain any number of structural sections having aspects as illustrated in the figures, as well as alternative structural aspects that may still benefit from operations of the present technology.

Method 300 may include additional operations prior to initiation of the listed operations. For example, additional processing operations may include forming structures on a semiconductor substrate, which may include both forming and removing material. Prior processing operations may be performed in the chamber in which method 300 may be performed, or processing may be performed in one or more other processing chambers prior to delivering the substrate into the semiconductor processing chamber in which method 300 may be performed. Regardless, method 300 may optionally include delivering a semiconductor substrate to a processing region of a semiconductor processing chamber, such as processing chamber 200 described above, or other chambers that may include components as described above. The substrate may be deposited on a substrate support, which may be a pedestal such as substrate support 204, and which may reside in a processing region of the chamber, such as processing volume 220 described above. An exemplary substrate 411 is illustrated in FIG. 4A, and may be or include aspects of a substrate on which operations according to the present technology may be performed.

The substrate 411 may be any number of materials on which materials may be deposited. The substrate may be or include silicon, germanium, dielectric materials including silicon oxide or silicon nitride, metal materials, or any number of combinations of these materials, which may be the substrate 411, or materials formed on substrate 411. In some embodiments optional treatment operations, such as a pretreatment, may be performed to prepare a surface of substrate 411 for deposition. Additionally, material removal may be performed, such as reduction of native oxides or etching of material, or any other operation that may prepare one or more exposed surfaces of substrate 411 for deposition.

In the embodiment shown in FIGS. 4A-4D, a first dielectric layer 413 may be formed on the substrate 411. In further embodiments, the first dielectric layer 413 may be a silicon oxide layer. The dielectric layer 413 may be formed from a silicon-containing precursor and/or an oxygen-containing precursor.

In embodiments, a semiconductor layer 415 may be formed on the dielectric layer 413. The dielectric layer 415 may be characterized by a gradient of etch resistance to an etch treatment that includes a peak etch resistance in the middle of the layer and lower etch resistances at the opposite ends of layer that are closest to and furthest from the dielectric layer 413. In embodiments, this etch resistance profile of the semiconductor layer 415 may counter an etch treatment that etches the opposite ends of the semiconductor layer at a higher rate than the middle of the layer. In embodiments, the counterbalancing of the etch rate of the etch treatment and the etch resistance profile of the semiconductor layer 415 creates an etch profile in the recessed semiconductor layer that is substantially straight with little or no concavity.

In embodiments of the present technology, the gradient of etch resistance in the semiconductor layer 415 may be created by altering one or more properties of the layer during deposition. In embodiments, these properties may include a gradient of the atomic percentage of a dopant in the layer. In general, a higher atomic percentage of dopant in the semiconductor layer 415 is correlated with a higher etch resistance to an etch treatment used to recess the layer. In further embodiments, these properties may include a gradient of the amount of stress in the semiconductor layer 415. In general, a higher stress level in the semiconductor layer 415 is correlated with a higher etch resistance to an etch treatment used to recess the layer In embodiments, the semiconductor layer 415 may include a gradient of an atomic percentage of dopant incorporated into the layer. Embodiments of the gradient may include a highest atomic percentage of dopant in a middle portion of the semiconductor layer 415, and lowest percentages of dopant in opposite end portions of the layer that are closest to and furthest from the dielectric layer 413. In some embodiments, the gradient may be a continuously changing atomic percentage of dopant through a thickness of the semiconductor layer 415, while in additional embodiments the gradient may include a plurality of portions where each portion is characterized by substantially the same atomic percentage of the dopant in that portion. In further embodiments the plurality of portions may include a middle portion that includes a middle point through the thickness of the semiconductor layer 415 that may be characterized by an atomic percentage of dopant that is greater than the atomic percentage of dopant in any other portion of the layer. In yet further embodiments, the plurality of portions may include a pair of opposite end portions that are closest to and furthest from the dielectric layer 413, at least one of which is characterized by a lowest atomic percentage of dopant in the semiconductor layer 415. In still further embodiments, the opposite end portions of the semiconductor layer 415 may have the same or different atomic percentages of dopant. In embodiments, the plurality of portions may include greater than or about three portions, greater than or about four portions, greater than or about five portions, greater than or about six portions, greater than or about seven portions, greater than or about eight portions, or more.

In additional embodiments, the semiconductor layer 415 may include a plurality of portions that independently may be characterized by a gradient of an atomic percentage of dopant or substantially the same atomic percentage of the dopant in that portion. In some embodiments, the plurality of portions may include at least three portions where a middle portion of the semiconductor layer 415 is characterized by substantially the same atomic percentage of the dopant while opposite end portions are characterized by gradients of the atomic percentage of the dopant.

Method 300 shown in FIG. 3 includes an embodiment of the processing methods that forms a semiconductor layer 415 from at least three portions. In embodiments, the first portion of the semiconductor layer 415a may have a lower etch resistance to an etch treatment than a second portion of the semiconductor layer 415b. In additional embodiments, the third portion of the semiconductor layer 415c, may also have a lower etch resistance to an etch treatment that the second portion of the semiconductor layer 415b. In still further embodiments, the first and third portions of the semiconductor layer 415a and 415c may have substantially similar etch resistances to the etch treatment. In yet additional embodiments, the first, second, and third portions of the semiconductor layer 415a-c may independently be characterized by a gradient of the atomic percentage of the dopant, or by substantially the same atomic percentage of the dopant.

Embodiments of method 300 include forming a first portion of a semiconductor layer on a substrate in operation 305. As illustrated in FIG. 4A, the first portion of the semiconductor layer 415a may be formed on the dielectric layer 413 that is present on substrate 411. In embodiments, the semiconductor layer may be a silicon-containing layer such as polysilicon. In further embodiments, the semiconductor layer may be a doped polysilicon layer. In still additional embodiments, the first and subsequent portions of the semiconductor layer may be formed by chemical vapor deposition of the portions of the layer on the substrate. In embodiments, the chemical vapor deposition may include the generation of a plasma from deposition precursors and the deposition of the first and subsequent portions of the semiconductor layer from the effluents of the deposition plasma.

In further embodiments, deposition of the first and subsequent portions of the semiconductor layer on the substrate may include flowing deposition precursors into a substrate processing region of a semiconductor processing chamber where the substrate is present. The deposition precursors may include one or more silicon-containing precursors and one or more doping precursors. In embodiments, the silicon-containing precursors may include silicon-and-hydrogen-containing precursors such as silane ($SiH_4$) and disilane ($Si_2H_6$), among other silicon-and-hydrogen-containing precursors. In further embodiments, the doping precursors may include phosphorous-containing doping precursors such as phosphine ($PH_3$). In still further embodiments, the doping precursors may include nitrogen-containing doping precursors such as ammonia ($NH_3$) and nitrous oxide ($N_2O$). In still further embodiments, additional deposition precursors may include carrier gases such as He, Ar, and molecular nitrogen ($N_2$). Additional deposition precursors may also include molecular hydrogen ($H_2$).

In embodiments, the first portion of the semiconductor layer 415a may be formed by flowing the deposition precursors in the semiconductor processing chamber at a first flow rate ratio of the doping precursors to the silicon-containing precursors. In further embodiments, this first flow rate ratio may be lower than a second flow rate ratio used to deposit a second portion of the semiconductor layer. In embodiments, the first flow rate ratio of doping precursors to silicon-containing precursors may be less than or about 1:1, less than or about 1:2, less than or about 1:3, less than or about 1:4, less than or about 1:5, less than or about 1:6, less than or about 1:7, less than or about 1:8, less than or about 1:9, less than or about 1:10, or less. In additional embodiments, a flow rate of the doping precursors during the deposition of the first portion of the semiconductor layer may be less than or about 5000 sccm, less than or about 4000 sccm, less than or about 3000 sccm, less than or about 2000 sccm, less than or about 1000 sccm, less than or about 500 sccm, less than or about 400 sccm, less than or about 300 sccm, less than or about 200 sccm, less than or about 100 sccm, or less. In still additional embodiments, a flow rate of the silicon-containing precursor may be greater than or about 100 sccm, greater than or about 250 sccm, greater than or about 500 sccm, greater than or about 750 sccm, greater than or about 1000 sccm, or more. In some embodiments, the flow rate of the silicon-containing precursor may remain constant during the deposition of the semiconductor layer. In additional embodiments, the flow rate of the silicon-containing precursor may change with the change in the flow rate ratio of doping precursors to silicon-containing precursors. In still additional embodiments, the flow rate of the silicon-containing precursors may vary while the flow rate of the dopant precursors remain constant throughout the deposition of the semiconductor layer. In yet additional embodiments, the deposition precursors may further include a carrier gas characterized by a flow rate greater than or about 500 sccm, greater than or about 1000 sccm, greater than or about 1500 sccm, greater than or about 2000 sccm, or more.

In additional embodiments, the first portion of the semiconductor layer 415a may be formed in a period less than or about 90 seconds, less than or about 60 seconds, less than or about 45 seconds, greater than or about 30 seconds, or less. In still further embodiments, the first portion of the semiconductor layer 415a may be formed to a thickness of less than or about 500 Å, less than or about 400 Å, less than or about 200 Å, less than or about 100 Å, or less.

Embodiments of method 300 may further include forming a second portion of a semiconductor layer on as substrate in operation 310. As illustrated in FIG. 4B, the second portion of the semiconductor layer 415b may be formed on the first portion of the semiconductor layer 415a previously deposited on substrate 411. In embodiments, the second portion of the semiconductor layer 415b may be formed under similar deposition conditions as the first portion of the semiconductor layer 415a except for a change in the flow rate ratio of the doping precursors to the silicon-containing precursors. In embodiments, a second flow rate ratio of the doping precursors to the silicon-containing precursors used to deposit the second portion of the semiconductor layer 415b may be greater than the first flow rate ratio used to deposit the first portion of the semiconductor layer 415a. In further embodiments, the second flow rate ratio of doping precursors to silicon-containing precursors may be greater than or about 1:10, greater than or about 1:9, greater than or about 1:8, greater than or about 1:7, greater than or about 1:6, greater than or about 1:5, greater than or about 1:4, greater than or about 1:3, greater than or about 1:2, greater than or about 1:1, or more. In additional embodiments, the increase in the second flow rate ratio compared to the first flow rate ratio may be greater than or about 5%, greater than or about 10%, greater than or about 15%, greater than or about 20%, greater than or about 30%, greater than or about 40%, greater than or about 50%, or more. In embodiments, the change in flow rate ratio of the doping precursors to silicon-containing precursors between the depositions of the first portion and second portion of the semiconductor layer 415a-b may be a continuous change or may be a stepwise change.

In additional embodiments, a flow rate of the doping precursors during the deposition of the second portion of the semiconductor layer may be greater than or about 100 sccm, greater than or about 250 sccm, greater than or about 300 sccm, greater than or about 400 sccm, greater than or about 500 sccm, greater than or about 1000 sccm, or more. In still additional embodiments, a flow rate of the silicon-containing precursor may be less than or about 1000 sccm, less than or about 750 sccm, less than or about 500 sccm, less than or about 250 sccm, less than or about 100 sccm, or less.

In additional embodiments, the second portion of the semiconductor layer 415b may be formed in a period greater than or about 1 second, greater than or about 10 seconds, greater than or about 30 seconds, greater than or about 45 seconds, greater than or about 60 seconds, greater than or about 90 seconds, or more. In still further embodiments, the second portion of the semiconductor layer 415b may be formed to a thickness of greater than or about 50 Å, greater than or about 100 Å, greater than or about 200 Å, greater than or about 300 Å, greater than or about 400 Å, greater than or about 500 Å, greater than or about 1000 Å, or more.

Embodiments of method 300 may still further include forming a third portion of a semiconductor layer on a substrate at operation 315. As illustrated in FIG. 4C, the third portion of the semiconductor layer 415c may be formed on the second portion of the semiconductor layer 415b previously deposited on substrate 411. In embodiments, the third portion of the semiconductor layer 415c may be formed under similar deposition conditions as the first and second portions of the semiconductor layer 415a-b except for another change in the flow rate ratio of the doping precursors to the silicon-containing precursors. In embodiments, a third flow rate ratio of the doping precursors to the silicon-containing precursors used to deposit the second portion of the semiconductor layer 415b may be less than the second flow rate ratio used to deposit the second portion of the semiconductor layer 415b. In further embodiments, the third flow rate ratio of doping precursors to silicon-containing precursors may be less than or about 1:1, less than or about 1:2, less than or about 1:3, less than or about 1:4, less than or about 1:5, less than or about 1:6, less than or about 1:7, less than or about 1:8, less than or about 1:9, less than or about 1:10, or less. In embodiments, the change in flow rate ratio of the doping precursors to silicon-containing precursors between the depositions of the first portion and second portion of the semiconductor layer 415a-b may be a continuous change or may be a stepwise change. In additional embodiments, the decrease in the third flow rate ratio compared to the second flow rate ratio may be greater than or about 5%, greater than or about 10%, greater than or about 15%, greater than or about 20%, greater than or about 30%, greater than or about 40%, greater than or about 50%, or more. In embodiments, the change in flow rate ratio of the doping precursors to silicon-containing precursors between the depositions of the second portion and third portion of the semiconductor layer 415b-c may be a continuous change or may be a stepwise change. In some embodiments, the third flow rate ratio may be the same as the first flow rate ratio.

In additional embodiments, a flow rate of the doping precursors during the deposition of the third portion of the semiconductor layer may be less than or about 500 sccm, less than or about 400 sccm, less than or about 300 sccm, less than or about 200 sccm, less than or about 100 sccm, less than or about 50 sccm, or less. In still additional embodiments, a flow rate of the silicon-containing precursor may be greater than or about 100 sccm, greater than or about 250 sccm, greater than or about 500 sccm, greater than or about 750 sccm, greater than or about 1000 sccm, or more.

In additional embodiments, the third portion of the semiconductor layer 415c may be formed in a period less than or about 90 seconds, less than or about 60 seconds, less than or about 45 seconds, greater than or about 30 seconds, or less. In still further embodiments, the third portion of the semiconductor layer 415c may be formed to a thickness of less than or about 500 Å, less than or about 400 Å, less than or about 200 Å, less than or about 100 Å, or less.

In some embodiments of the present technology, different portions of a semiconductor layer may be formed with different stress levels. The different stress levels may be correlated with different etch rates for each portion of the layer. In embodiments, an increased stress level in the deposited portion of the semiconductor layer may be correlated with an increased etch resistance (i.e., lower etch rate) for that portion. In additional embodiments, changing the stress levels of the deposited portions of the semiconductor layer may replace changing the atomic percentage of a dopant in order to change the etch rate. In further embodiments, both the stress level and atomic percentage of a dopant may be used to form portions of the semiconductor layer characterized by different etch rates.

In embodiments, a portion of the semiconductor layer that includes a midpoint depth of the level may be characterized by a higher level of stress than portions of the semiconductor layer at the ends of the level. Referring to FIGS. 4A-D, embodiments may include the second portion of the semiconductor layer 415b being characterized by a higher amount of stress than either the first portion of the level 415a or the third portion of the level 415c. In additional embodiments, the percentage different in the amount of stress between the second portion and the first or third portions may be greater than or about 5%, greater than or about 10%, greater than or about 15%, greater than or about 20%, greater than or about 25%, greater than or about 30%, or more. In still further embodiments, the second portion of the level 415b may have a stress level that is greater than or about 100 MPa, greater than or about 500 MPa, greater than or about 1 GPa, greater than or about 1.5 GPa or more. In yet additional embodiments, the first and third portions of the semiconductor level 415a and 415 may have a stress level that is less than or about 1 GPa, less than or about 500 MPa, less than or about 100 MPa, less than or about 50 MPa, less than or about 10 MPa, or less.

In embodiments, the pressure within the processing chamber during the formation of the semiconductor layer may be less than or about 30 Torr, and may be less than or about 20 Torr, less than or about 15 Torr, less than or about 12 Torr, less than or about 10 Torr, less than or about 8 Torr, less than or about 6 Torr, less than or about 5 Torr, less than or about 4 Torr, less than or about 3 Torr, less than or about 2 Torr, less than or about 1 Torr, or less. For some embodiments, such as with processing chambers including an inductively-coupled plasma source, and or a turbomolecular pump, processing pressures may be further reduced to less than or about 100 mTorr, less than or about 90 mTorr, less than or about 80 mTorr, less than or about 70 mTorr, less than or about 60 mTorr, less than or about 50 mTorr, less than or about 40 mTorr, less than or about 30 mTorr, less than or about 20 mTorr, less than or about 10 mTorr, less than or about 5 mTorr, less than or about 2 mTorr, or less.

In embodiments, the temperature of the substrate during of the formation of the semiconductor layer may be above or about 200° C., and may be greater than or about 250° C., greater than or about 300° C., greater than or about 350° C., greater than or about 400° C., greater than or about 450° C., greater than or about 500° C., or higher. A variety of plasma powers and other chamber conditions may similarly be modified during the formation of the semiconductor layer.

Embodiments of method 300 may also optionally include forming a dielectric layer on the deposited semiconductor layer at operation 320. In the embodiment shown in FIG. 4D, the deposited dielectric layer is shown as a second dielectric layer 420 formed over the semiconductor layer 415. In embodiments, the first and second dielectric layers 413 and 420 may be formed by introducing dielectric deposition precursors into the substrate processing region of the semiconductor processing chamber. In embodiments, these dielectric deposition precursors may include silicon-containing precursors such as silane ($SiH_4$), disilane ($Si_2H_6$), organosilanes, silicon tetrafluoride ($SiF_4$), silicon tetrachloride ($SiCl_4$), dichlorosilane ($SiH_2Cl_2$), tetraethyl orthosilicate (TEOS), among other silicon-containing precursors.

The dielectric deposition precursors may also include oxygen-containing precursors used in any operation as described throughout the present technology may include $O_2$, $N_2O$, $NO_2$, $O_3$, $H_2O$, as well as any other oxygen-containing precursors that may be used in silicon oxide film formation, or other film formation. In some embodiments, the dielectric precursors may include nitrogen-containing precursors such as $N_2$, $N_2O$, $NO_2$, $NH_3$, $N_2H_2$, among other nitrogen-containing precursors. In any of the formation operations one or more additional precursors may be included, such as inert precursors, which may include Ar, He, Xe, Kr, nitrogen, hydrogen, or other precursors.

In embodiments, the dielectric layers 413 and 420 may be silicon oxide layers. In additional embodiments, a stoichiometry of the silicon oxide in the layers may be adjusted to increase the layer's properties. By increasing the silicon-like properties of the layer, structural integrity may be increased relative to other silicon oxide layers. To increase the stoichiometric ratio of the formed dielectric layers, in some embodiments dielectric deposition precursor delivery may be modified from standard silicon oxide deposition conditions. For example, during some processing, the silicon-to-oxide atomic ratio may be up to 1:7 in some embodiments. During formation methods according to some embodiments of the present technology, the silicon-to-oxide ratio may be adjusted to less than or about 1:7, and may be adjusted to less than or about 1:6, less than or about 1:5, less than or about 1:4, less than or about 1:3, less than or about 1:2, less than or about 1:1, or less. By providing a relatively oxygen-starved formation process compared to other formations, the oxygen-to-silicon ratio within the produced film may be less than or about 2.0:1, and may be less than or about 1.9:1, less than or about 1.8:1, less than or about 1.7:1, less than or about 1.6:1, less than or about 1.5:1, or less.

By increasing the silicon incorporation within the dielectric layer, a Young's modulus of the modified oxide layer may be increased to greater than or about 100 GPa, and may be increased to greater than or about 110 GPa, greater than or about 120 GPa, greater than or about 125 GPa, greater than or about 130 GPa, greater than or about 135 GPa, greater than or about 140 GPa, greater than or about 145 GPa, greater than or about 150 GPa, greater than or about 155 GPa, greater than or about 160 GPa, or higher. Additionally, the dielectric layer's hardness may increase to greater than or about 12 GPa, and may increase to greater than or about 13 GPa, greater than or about 14 GPa, greater than or about 15 GPa, greater than or about 16 GPa, greater than or about 17 GPa, or higher.

In embodiments, the dielectric layers 413 and 420 may function to electrically insulate semiconductor structures formed in the semiconductor layer 415. In further embodiments, the dielectric layers 413 and 420 may be characterized by a leakage current density that can be maintained at less than or about $1 \times 10^{-6}$ $A/cm^2$, less than or about $8 \times 10^{-7}$ $A/cm^2$, less than or about $5 \times 10^{-7}$ $A/cm^2$, less than or about $2 \times 10^{-7}$ $A/cm^2$, less than or about $1 \times 10^{-7}$ $A/cm^2$, less than or about $9 \times 10^{-8}$ $A/cm^2$, less than or about $8 \times 10^{-8}$ $A/cm^2$, less than or about $7 \times 10^{-8}$ $A/cm^2$, less than or about $6 \times 10^{-8}$ $A/cm^2$, less than or about $5 \times 10^{-8}$ $A/cm^2$, less than or about $4 \times 10^{-8}$ $A/cm^2$, less than or about $3 \times 10^{-8}$ $A/cm^2$, less than or about $2 \times 10^{-8}$ $A/cm^2$, less than or about $1.5 \times 10^{-8}$ $A/cm^2$, less than or about $1.2 \times 10^{-8}$ $A/cm^2$, less than or about $1 \times 10^{-8}$ $A/cm^2$, or less.

In additional embodiments, the dielectric layers 413 and 420 may be characterized by a breakdown voltage greater than or about 6.0 MV/cm, greater than or about 7.0 MV/cm, greater than or about 7.5 MV/cm, greater than or about 8.0

MV/cm, greater than or about 8.5 MV/cm, greater than or about 9.0 MV/cm, greater than or about 9.5 MV/cm, greater than or about 10.0 MV/cm, greater than or about 10.5 MV/cm, greater than or about 11.0 MV/cm, greater than or about 11.5 MV/cm, greater than or about 12.0 MV/cm, greater than or about 12.5 MV/cm, or higher. Consequently, the present technology may produce dielectric layers that may be characterized by strong resistance to deformation and collapse during wet etch or other removal processes, and that may substantially retain improved electrical performance.

Embodiments of method 300 may yet further include etching an opening through the semiconductor layer at operation 325. In the embodiment shown in FIG. 4D, the above described portions of the semiconductor layer 415 are shown as a single layer that may be characterized by a higher atomic percentage of a dopant in the middle of the layer than in the ends of the layer that contact the dielectric layers 413 and 420. The opening 422 formed in the semiconductor layer 415 is also formed in the dielectric layers 413 and 420 that sandwich opposite sides of the semiconductor layer 415.

In embodiments, the opening 422 etched in the semiconductor layer 415 also includes recesses that extend into the regions between the dielectric layers 413 and 420. Each recess may include a pair of opposite sides that are defined by opposite facing surfaces of the dielectric layers 413 and 420. Each recess may also include a side that is formed by an etch front of an etching operation that forms the recesses. In embodiments, each of the recesses may be described as an opening itself, with a height that may be measured as the extent the semiconductor layer 415 has been etch back from the orthogonally-aligned opening 422, and a width that may be measured as the distance between the opposite facing surfaces of dielectric layers 413 and 420.

In further embodiments, the side of these recessed openings formed by the etch front may be substantially straight with little or no concavity between the midpoint and ends of the side. In still further embodiments, the side of these recessed openings formed by the etch front may be characterized by a variation in the width between the midpoint and either end of the side that is less than or about 5 Å, less than or about 4 Å, less than or about 3 Å, less than or about 2 Å, less than or about 1 Å, or less. The reduction of concavity in the side of the recessed openings formed by the etch front permits a reduction in the size of a device that includes the interface of the side with an unetched portion of the semiconductor layer 415. This reduction in size removes a limitation on size reduction for devices that include the interface, and permits an increased device density on the substrate.

In embodiments, the etching operation 325 may include selectively etching the semiconductor layer 415 over the adjacent dielectric layers 413 and 420. In additional embodiments, the removal of a portion of the semiconductor layer 415 may include a silicon removal operation performed with one or more precursors including a fluorine-containing precursor, and may also include a hydrogen-containing precursor, as well as one or more additional precursors, which may include an inert or noble gas, such as helium, argon, or other materials which may facilitate the etch process. In some embodiments, one or both of the fluorine-containing precursor or the hydrogen-containing precursor may be flowed into a remote plasma region of the dry etch processing chamber. For example, the remote plasma region may be fluidly coupled with a processing region housing the substrate, although the region may be physically separated, such as by a showerhead, which may operate as an electrode within the remote plasma region. A remote plasma system may also be coupled with the chamber externally and provide plasma effluents into the chamber.

Plasma effluents of the precursors may be delivered into the processing region to contact the semiconductor layer 415 and selectively remove a portion of the layer over the adjacent dielectric layers 413 and 420. In embodiments, processing conditions may be configured in one or more ways to provide a selective etch of silicon relative to oxide, which may be characterized by a selectivity of greater than or about 100:1. For example, the processing chamber, pedestal, or substrate may be maintained at a temperature of between about 40° C. and about 150° C. during the etching or removal operation, and a pressure within the processing chamber may be maintained below or about 12 Torr, for example. Additionally, in some embodiments flow rates of the fluorine-containing precursor and/or the hydrogen-containing precursor may be modulated, such as to maintain a flow rate ratio between the precursors.

For example, in some embodiments, the removal may be performed while maintaining an atomic flow-rate ratio of hydrogen to fluorine of greater than or about 10:1. Such a process may maintain hydrogen terminated surfaces, which may allow fluorine to remove silicon selectively over oxide. Exemplary hydrogen-containing precursors may include one or more precursors including hydrogen, such as diatomic hydrogen, ammonia, hydrocarbons, or other precursors including hydrogen. Exemplary fluorine-containing precursors may include one or more precursors including atomic fluorine, diatomic fluorine, bromine trifluoride, chlorine trifluoride, nitrogen trifluoride, hydrogen fluoride, fluorinated hydrocarbons, sulfur hexafluoride, or xenon difluoride, as non-limiting examples. Subsequent removal of the silicon layers, further processing may be conducted, including the deposition of floating gate semiconductor materials in the recessed regions formed by the etch operation.

In some embodiments of the present technology, additional treatment operations may be performed following the etching operation. In embodiments, an annealing operation may be performed, such as at temperatures greater than or about 700° C., and which may be greater than or about 750° C., greater than or about 800° C., greater than or about 850° C., greater than or about 900° C., or greater. The anneal may be performed with a heated precursor, such as an inert precursor including nitrogen, for example.

In embodiments of the semiconductor structure 400 shown in FIGS. 4A-D, the thicknesses of the layers in structure 400 may be or include ranges of thicknesses to produce memory or other semiconductor structures. For example, in some embodiments, the semiconductor layer 415 and the dielectric layers 413 and 420 may be less than or about 100 nm, less than or about 90 nm, less than or about 80 nm, less than or about 70 nm, less than or about 60 nm, less than or about 50 nm, less than or about 45 nm, less than or about 40 nm, less than or about 35 nm, less than or about 30 nm, less than or about 25 nm, less than or about 20 nm, less than or about 15 nm, less than or about 10 nm, or less. In some embodiments the layers may be substantially the same thickness while in additional embodiments the layers may have different thicknesses. In some embodiments the dielectric layers 413 and 420 may have thicknesses sufficient to limit crosstalk or leakage between developed cells. In additional embodiments, the semiconductor layer 415 may be characterized by a thickness less than or about the thickness of one or both dielectric layers 413 and 420.

Figure 5:
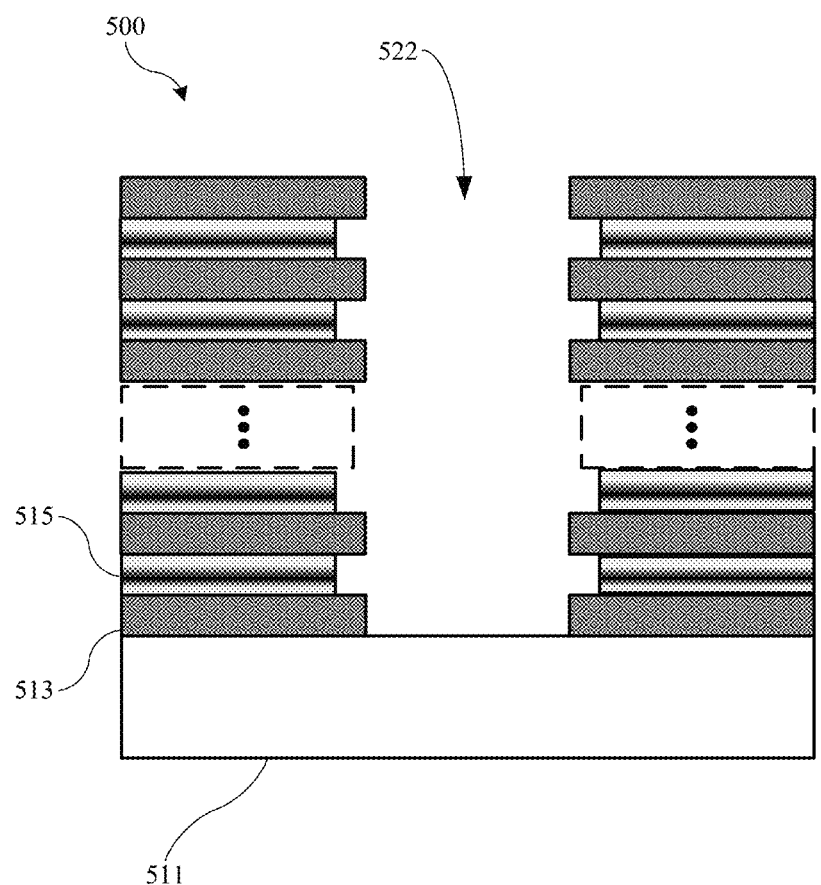
FIG. 5 shows schematic cross-sectional views of a substrate during formation operations according to additional embodiments of the present technology.

Additional embodiments of the present technology may include semiconductor structures having two or more pairs of layers that include a dielectric layer and a semiconductor layer. An embodiment of these structures is shown in FIG. 5, which shows a structure 500 that includes multiple pairs that include a dielectric layer 513 and a semiconductor layer 515 formed on a substrate 511. In the embodiment shown, an opening 522 is formed through the stack of layer pairs. The semiconductor layers 515 are recessed back from the opening 522 to form recessed openings between adjacent dielectric layers 513. In embodiments, the number of pairs of layers 513 and 515 in structure 500, may be greater than or about 10 pairs, greater than or about 25 pairs, greater than or about 50 pairs, greater than or about 100 pairs, greater than or about 200 pairs, or more.

In further embodiments, the side of these recessed openings formed by the etch front in semiconductor layers 515 may be substantially straight with little or no concavity between the midpoint and ends of the side. In still further embodiments, the side of these recessed openings formed by the etch front may be characterized by a variation in the width between the midpoint and either end of the side that is less than or about 5 Å, less than or about 4 Å, less than or about 3 Å, less than or about 2 Å, less than or about 1 Å, or less. The reduction of concavity in the side of the recessed openings formed by the etch front permits a reduction in the size of a device that includes the interface of the side with an unetched portion of the semiconductor layer 515. This reduction in size removes a limitation on size reduction for devices that include the interface, and permits an increased device density on the substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor structure comprising:
at least one pair of layers comprising a dielectric layer and a semiconductor layer, wherein the semiconductor layer comprises:
a first portion of the semiconductor layer characterized by a first etch rate for an etch treatment,
a second portion of the semiconductor layer characterized by a second etch rate that is less than the first etch rate for the etch treatment, and
a third portion of the semiconductor layer characterized by a third etch rate that is greater than the second etch rate;
wherein the second portion is positioned between the first portion and the third portion, and the second portion of the semiconductor layer is characterized by a greater atomic percentage of phosphorous or nitrogen than the first portion or the third portion of the semiconductor layer and/or the second portion of the semiconductor layer is characterized by a higher amount of stress than the first portion or third portion of the semiconductor layer.

2. The semiconductor structure of claim 1, wherein the dielectric layer comprises silicon oxide.

3. The semiconductor structure of claim 1, wherein the semiconductor layer comprises doped polysilicon.

4. The semiconductor structure of claim 1, wherein at least one pair of layers comprises greater than or about 50 pairs of layers.

5. The semiconductor structure of claim 1, further comprising a second dielectric layer, wherein the semiconductor layer is formed between the dielectric layer and the second dielectric layer.

6. The semiconductor structure of claim 5, wherein the dielectric layer, the second dielectric layer, or both the dielectric layer and the second dielectric layer comprise a silicon oxide having a silicon-to-oxygen ration of less than or about 1:7.

7. The semiconductor structure of claim 5, wherein a side of the semiconductor layer is recessed from a side of the dielectric layer, the second dielectric layer, or both the dielectric layer and the second dielectric layer.

8. The semiconductor structure of claim 7, wherein the semiconductor layer is characterized by a variation in a width of the semiconductor layer between a midpoint of the semiconductor layer and an end adjacent the dielectric layer, an end adjacent the second dielectric layer, or both, of less than or about 5 Å, wherein the width of the semiconductor layer extends from the recessed side to a second side.

\* \* \* \* \*